United States Patent
Hiraki

(10) Patent No.: US 8,215,005 B2
(45) Date of Patent: Jul. 10, 2012

(54) CHIP MOUNTING SYSTEM

(75) Inventor: Tsutomu Hiraki, Saga (JP)

(73) Assignee: Panasonic Corporation, Osaka (JP)

( * ) Notice: Subject to any disclaimer, the term of this patent is extended or adjusted under 35 U.S.C. 154(b) by 9 days.

(21) Appl. No.: 12/745,771

(22) PCT Filed: Dec. 3, 2008

(86) PCT No.: PCT/JP2008/072360
§ 371 (c)(1),
(2), (4) Date: Jun. 2, 2010

(87) PCT Pub. No.: WO2009/072659
PCT Pub. Date: Jun. 11, 2009

(65) Prior Publication Data
US 2010/0257727 A1 Oct. 14, 2010

(30) Foreign Application Priority Data

Dec. 3, 2007 (JP) ................................ P2007-312093
Dec. 3, 2007 (JP) ................................ P2007-312094

(51) Int. Cl.
*H05K 13/04* (2006.01)
(52) U.S. Cl. ............... 29/740; 29/739; 29/741; 29/742; 29/833
(58) Field of Classification Search ............ 29/832–834, 29/740–743, 840–842; 228/180.21–180.22
See application file for complete search history.

(56) References Cited

U.S. PATENT DOCUMENTS

| | | | | |
|---|---|---|---|---|
| 5,839,187 A * | 11/1998 | Sato et al. | | 29/743 |
| 5,871,610 A | 2/1999 | Minohoshi et al. | | |
| 6,792,676 B2 * | 9/2004 | Haji et al. | | 29/832 |
| 7,827,677 B2 * | 11/2010 | Ueno et al. | | 29/740 |
| 2003/0071109 A1* | 4/2003 | Arikado | | 228/180.1 |
| 2010/0257727 A1* | 10/2010 | Hiraki | | 29/729 |
| 2010/0257728 A1* | 10/2010 | Hiraki | | 29/739 |
| 2010/0299916 A1* | 12/2010 | Hiraki | | 29/740 |

FOREIGN PATENT DOCUMENTS

EP   2 056 766 A   3/1981

(Continued)

OTHER PUBLICATIONS

International Search Report for PCT/JP2008/072360.

*Primary Examiner* — Minh Trinh
(74) *Attorney, Agent, or Firm* — Pearne & Gordon LLP

(57) ABSTRACT

A chip mounting system in which a whole system can be compact including a transfer stage and a tool holding member between a chip feeding section and a substrate holding section. In the chip mounting system, a transfer stage is disposed between a chip feeding stage and a substrate holding stage. A pick-up head and a mounting head are provided movably in a Y-axis direction in which the chip feeding stage and the substrate holding stage are aligned. A movable table which is movable in an X-axis direction, which intersects the Y-axis direction at right angles, is provided in a overwrapping movable region of the chip feeding stage and the substrate holding stage. The transfer stage and a tool holding member, which holds at least one of replacement tools for a pick-up tool and a mounting tool, are provided on the movable table.

8 Claims, 13 Drawing Sheets

| | FOREIGN PATENT DOCUMENTS | | |
|---|---|---|---|
| GB | 2 056 766 A | 3/1981 | |
| JP | 57-145394 A | 9/1983 | |
| JP | 01-138800 A | 5/1989 | |
| JP | 4-321243 A | 11/1992 | |
| JP | H05-15499 U | 2/1993 | |
| JP | 2001-015533 A | 1/2001 | |
| JP | 2006-080158 A | 3/2006 | |
| WO | 2007-108352 A1 | 9/2007 | |

\* cited by examiner

CHIP MOUNTING SYSTEM

TECHNICAL FIELD

The present invention relates to a chip mounting system in which a chip fed from a chip feeding section is picked up to be placed on a substrate which is held by a substrate holding section.

BACKGROUND ART

In chip mounting systems, a substrate to which an adhesive has been applied by an adhesive application unit is transported to be held in a substrate holding section, while a chip fed from a chip feeding section is picked up by a mounting head so as to be mounted on the substrate held by the substrate holding section. Among chip mounting systems of this type, there is known a chip mounting system which is not such that a mounting head picks up a chip fed from a feeding section so as to mount the chip so picked up directly on to a substrate but such that a pick-up head which is provided separately from a mounting head picks up a chip fed from a chip feeding section, and the mounting head receives the chip so picked by the pick-up head directly or via a transfer stage which is disposed between the chip feeding section and the substrate holding section, so that the chip so received is then mounted on a substrate (Patent Document 1).

Patent Document 1: JP-A-2001-15533

Here, in the chip mounting system configured as has been described above in which the chip is placed on to the substrate by way of the transfer stage, the transfer stage accessed by both the pick-up head and the mounting head is desirably provided in the area which lies between the chip feeding section and the substrate holding section. In addition, the chip picking-up tools provided on the pick-up head and the mounting head need to be replaced in accordance with the shape of a chip they pick up, and the tool holding member for holding such a replacement tool in advance is also desirably provided in the area which lies between the chip feeding section and the substrate holding section.

However, in recent chip mounting systems in which various types of components and mechanisms are disposed crowded closely together from the viewpoint of achieving compactness, there has been caused a problem that it is difficult to install the transfer stage and the tool holding member in the area lying between the chip feeding section and the substrate holding section.

Here, in the chip mounting system configured as has been described above in which the mounting head receives the chip from the pick-up head to mount the chip so received on the substrate, not only a tool that is used by the mounting head to pick up the chip but also a tool that is used by the pick-up head to pick up the chip are necessary, and moreover, these tools need to be changed depending upon the shape of a chip to be mounted. Therefore, a tool holding member which holds in advance replacement tools for the pick-up tools needs to be provided in a region which can be accessed by both the pick-up head and the mounting head. To make this happen, the tool holding member is desirably installed in a region defined between the chip feeding section and the substrate holding section.

However, in recent chip mounting systems in which various types of components and mechanisms are disposed crowded closely together from the viewpoint of achieving compactness, there has been caused a problem that it is difficult to install the tool holing member in the area lying between the chip feeding section and the substrate holding section.

DISCLOSURE OF THE INVENTION

The invention has been made in view of the situations and an object thereof is to provide a chip mounting system which can be made compact in size as a whole irrespective of the fact that a transfer stage and a tool holding member are provided between chip feeding section and a substrate holding section.

Also, the invention has been made in view of the situations described above and an object thereof is to provide a chip mounting system which can be made compact in size as a whole irrespective of the fact that a tool holding member which can be accessed by both a pick-up head and a mounting head is installed between a chip feeding section and a substrate holding section.

With a view to achieving the object, according to a first aspect of the invention, there is provided a chip mounting system including a chip feeding section for feeding chips, a substrate holding section for holding a substrate, a transfer stage disposed between the chip feeding section and the substrate holding section, a pick-up head provided in such a manner as to move freely in a first direction which is horizontal and in which the chip feeding section and the substrate holding section are aligned for picking up a chip fed from the chip feeding section with a pick-up tool to transfer the chip so picked up to a transfer stage, a mounting head provided in such a manner as to move freely in the first direction for picking up the chip transferred to the transfer stage by the pick-up head with a mounting tool to place the chip on to a substrate held in the substrate holding section, and a tool holding member for holding at least a replacement tool for the pick-up tool or the mounting tool, wherein a movable table which is able to move freely in a second direction which is horizontal and which intersects the first direction at right angles is provided in an area lying between the chip feeding section and the substrate holding section, so that the transfer stage and the tool holding member are provided on the movable table.

According to a second aspect of the invention, there is provided a chip mounting system as set forth in the first aspect of the invention, wherein a camera is provided on the movable table in such a manner that an image sensing plane is oriented upwards.

With a view to achieving the object, according to a third aspect of the invention, there is provided a chip mounting system including a chip feeding section for feeding chips, a substrate holding section for holding a substrate, a pick-up head provided movably in a first direction which is horizontal and in which the chip feeding section and the substrate holding section are aligned for picking up a chip fed from the chip feeding section by a pick-up tool, a mounting head provided movably in the first direction for receiving the chip picked up by the pick-up head by a mounting tool so as to mount the chip so received on to a substrate held on the substrate holding section, and a tool holding member for holding replacement tools for the pick-up tool and the mounting tool, respectively, wherein a movable table is provided in a region defined between the chip feeding section and the substrate holding section in such a manner as to move freely in a second direction which intersects the first direction at right angles, so that the tool holding member is provided in an overlapping region of a movable region of the pick-up head and a movable region of the mounting head on the movable table.

According to a fourth aspect of the invention, there is provided a chip mounting system as set forth in the first aspect of the invention, including an application head provided movably in the first direction for applying using an application tool an adhesive to a substrate on to which a chip has not yet been mounted by the mounting head, and wherein the tool holding member is provided on an overlapping region of the movable region of the pick-up head, the movable region of the mounting head and a movable region of the application head on the movable table, and a replacement tool for the application tool is held on the tool holding member.

In the invention, since the movable table which is able to move freely in the horizontal direction (the second direction) which intersects at right angles the horizontal direction (the first direction) in which the chip feeding section and the substrate holding section are aligned is provided in the area lying between the chip feeding section and the substrate holding section, so that the transfer stage and the tool holding member are provided on the movable table, the chip mounting system can be made compact in size as a whole irrespective of the fact that the transfer stage and the tool holding member are installed between the chip feeding section and the substrate holding section.

In the invention, since the movable table is provided in the region defined between the chip feeding section and the substrate holding section in such a manner as to move freely in the horizontal direction (the second direction) which intersects the horizontal direction (the first direction) at right angles, so that the tool holding member is provided in the overlapping region of the movable region of the pick-up head and the movable region of the mounting head on the movable table, the chip mounting system can be made compact in size as a whole irrespective of the fact that the tool holding member which can be accessed by both the pick-up head and the mounting head is installed between the chip feeding section and the substrate holding section. In addition, since the movable table is made to move freely in the direction which intersects at right angles the direction in which the chip feeding section and the substrate holding section and any position on the movable table can be accessed by both the pick-up head and the mounting head in the event that the movable table is moved, the working properties of the system can be enhanced further in the event that other equipment which is shared by the pick-up head and the mounting head than the tool holding member is made to be mounted on the movable table.

BEST MODE FOR CARRYING OUT THE INVENTION

Embodiment 1

Figure 1:
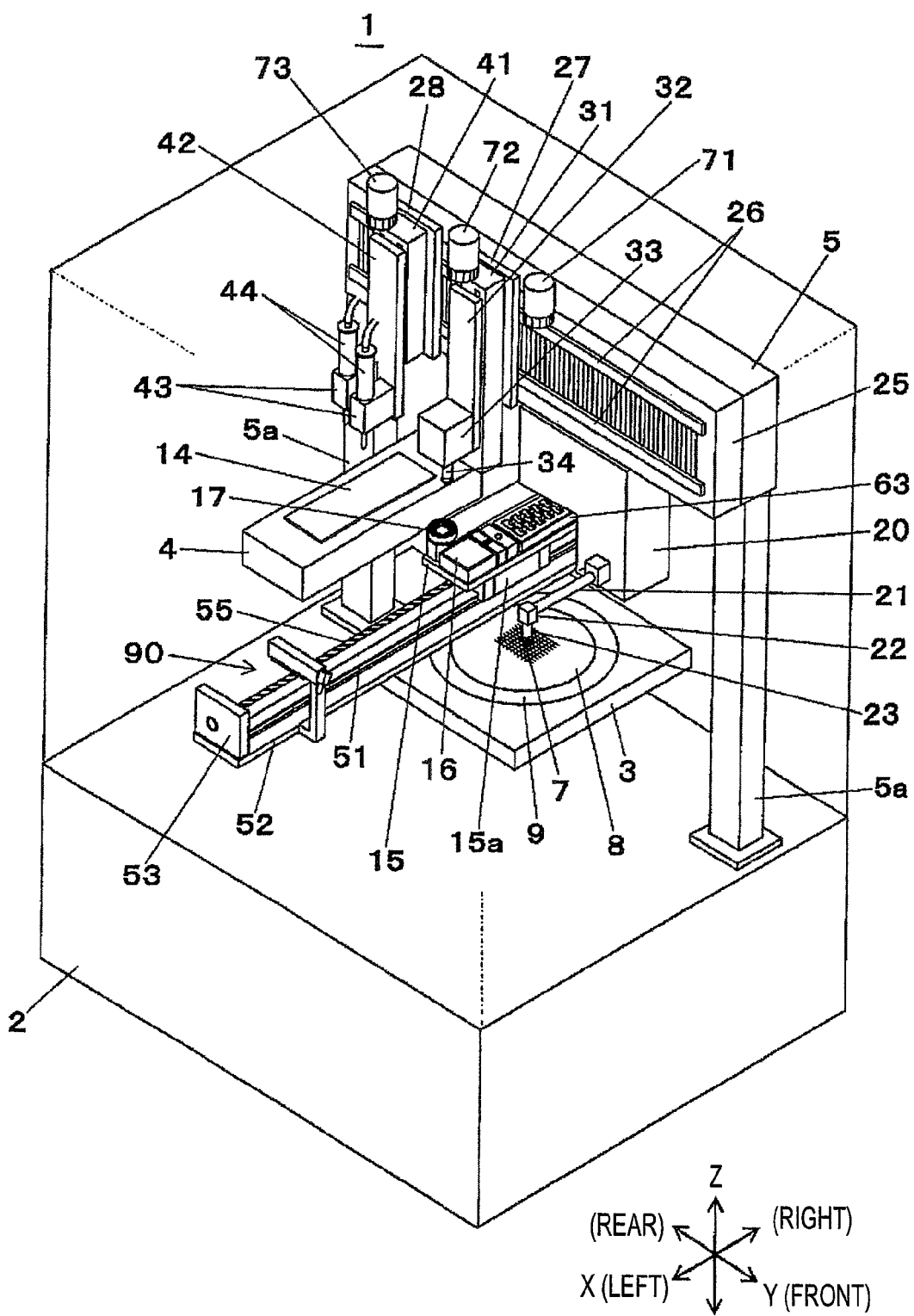
FIG. 1 is a perspective view of a chip mounting system according to Embodiment 1 of the invention.
Figure 2:
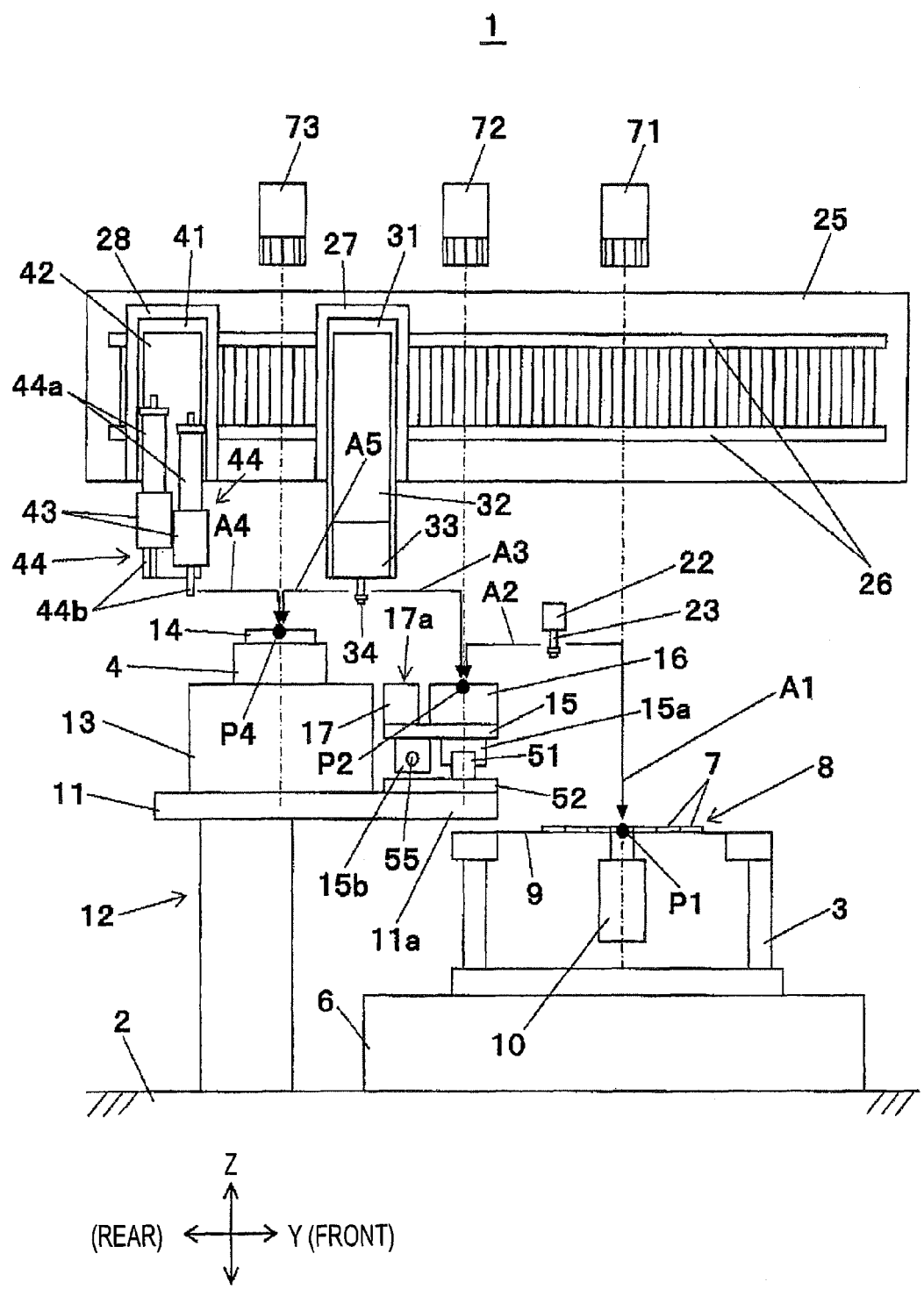
FIG. 2 is a front view of a main part of the chip mounting system according to Embodiment 1 of the invention.
Figure 3:
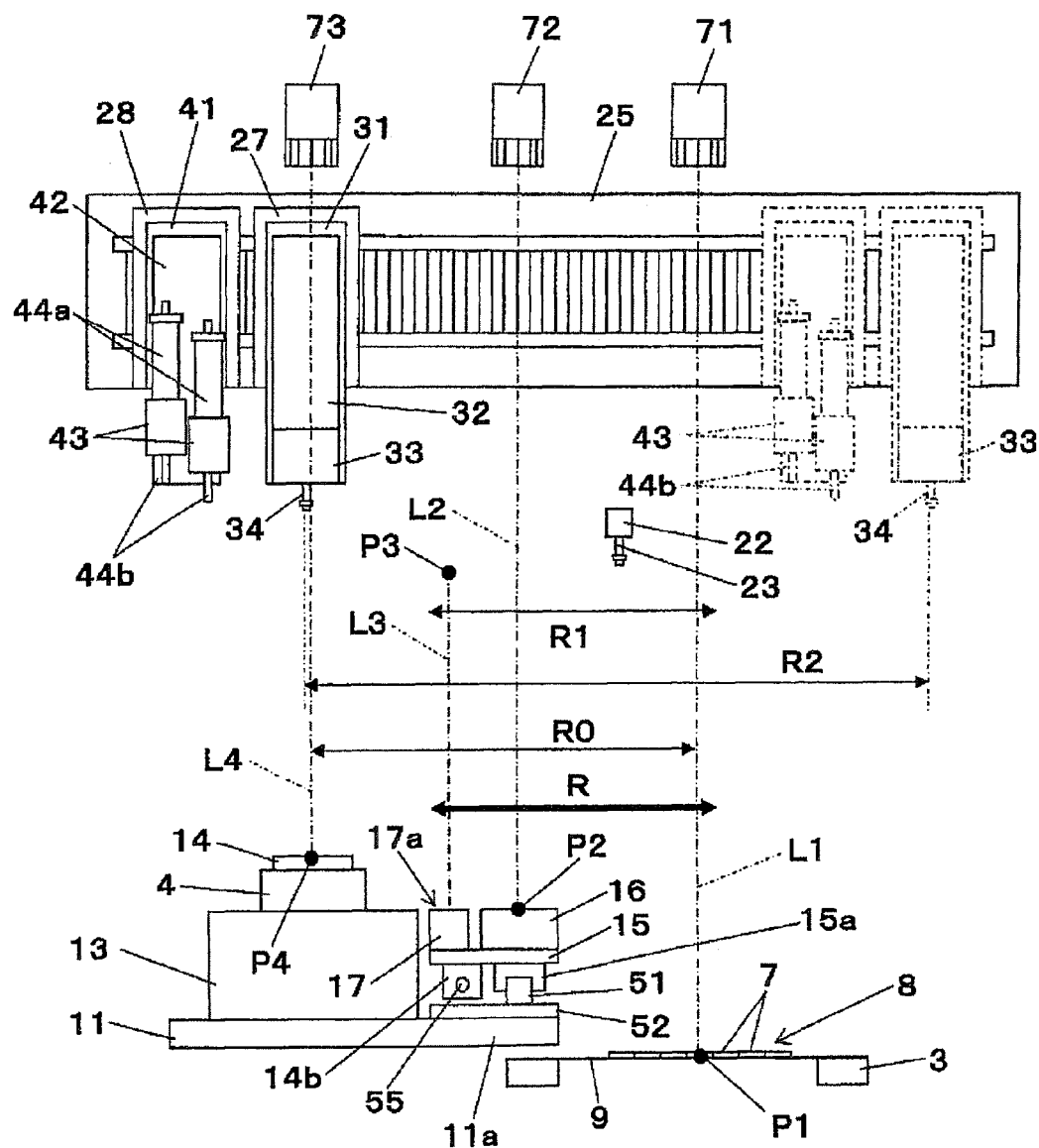
FIG. 3 is a front view of the main part of the chip mounting system according to Embodiment 1 of the invention.
Figure 4:
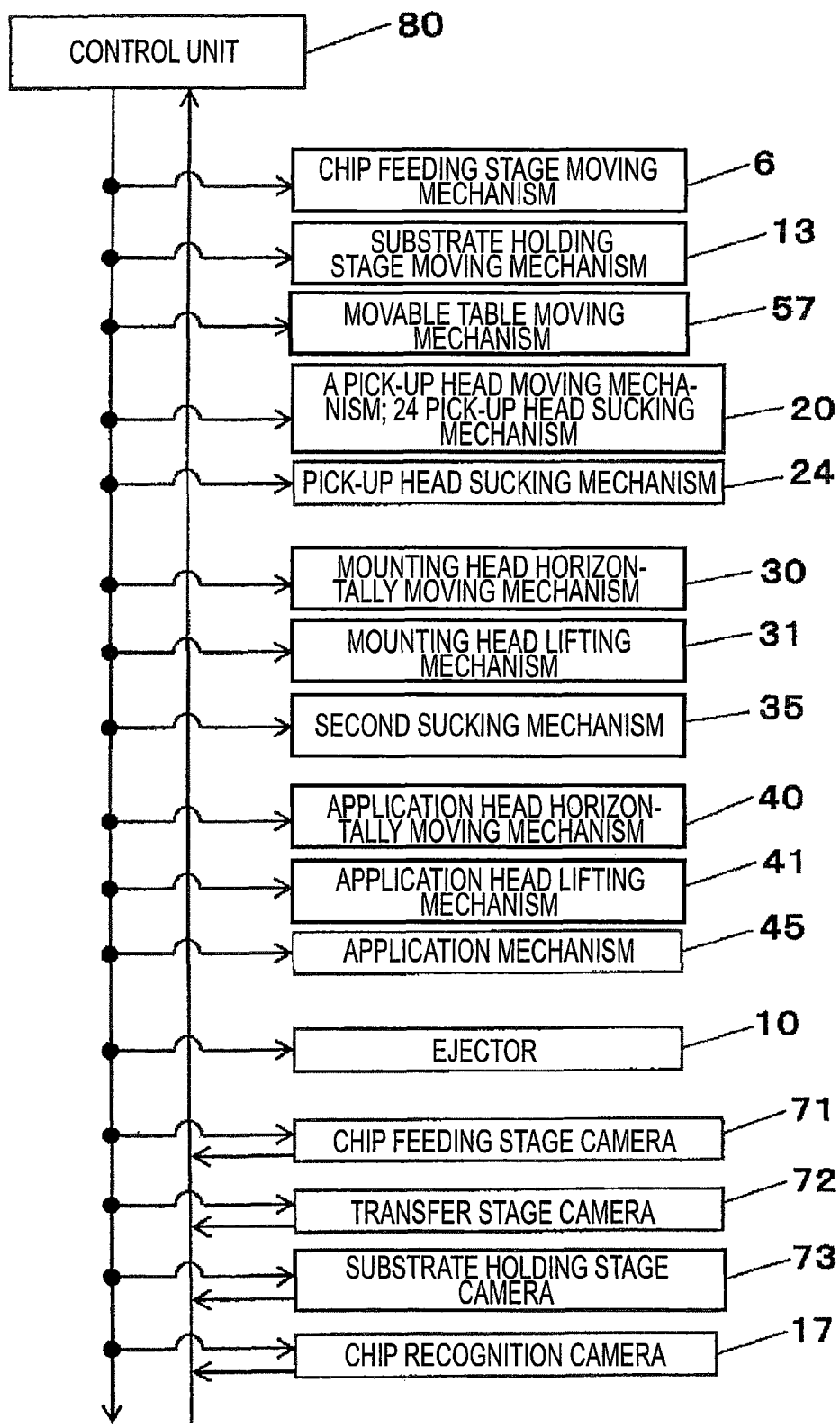
FIG. 4 is a block diagram showing a control system of the chip mounting system according to Embodiment 1 of the invention.
Figure 5:
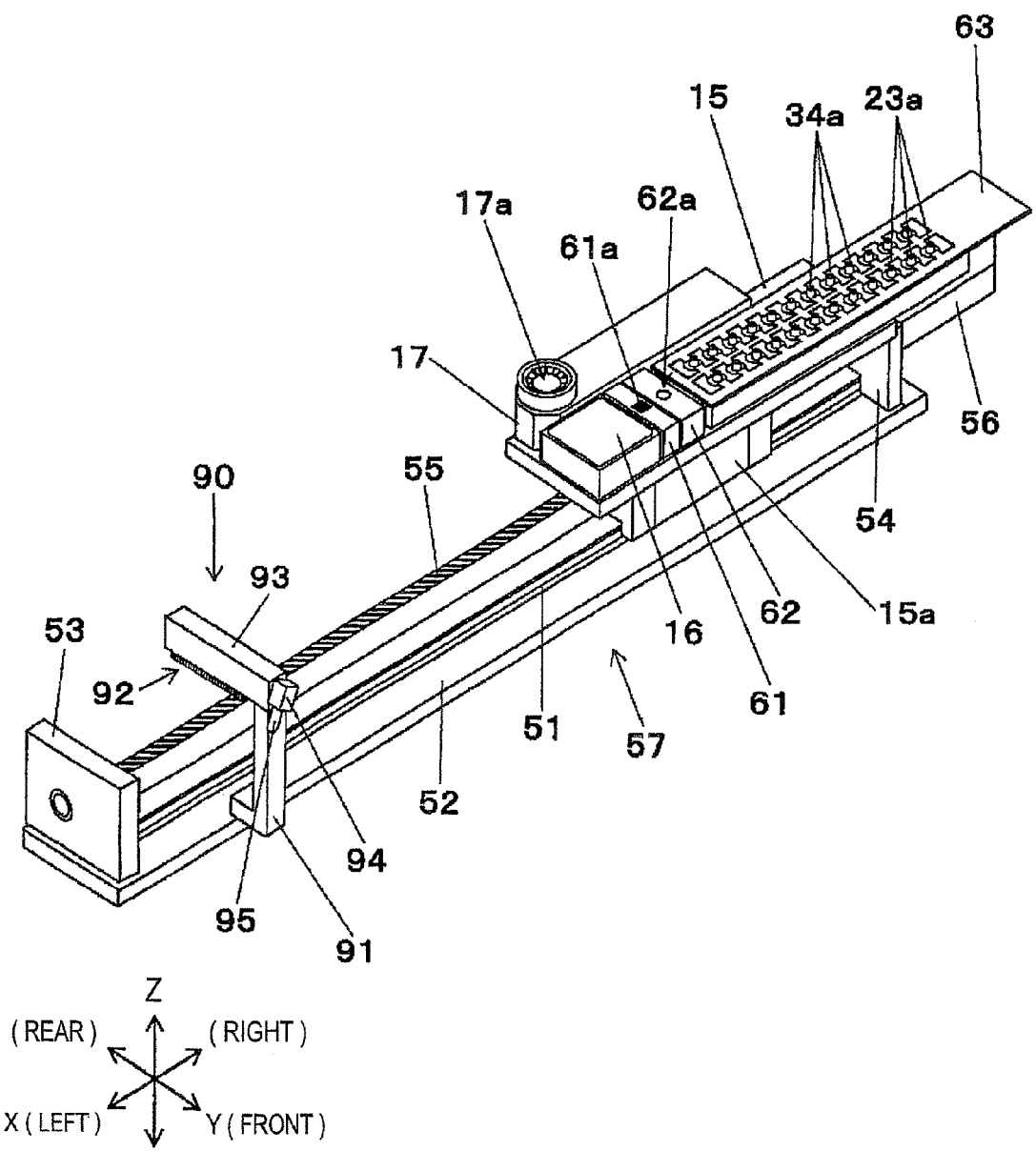
FIG. 5 is a perspective view of a movable table and a movable table moving mechanism which are provided on the chip mounting system according to Embodiment 1 of the invention.
Figure 6:
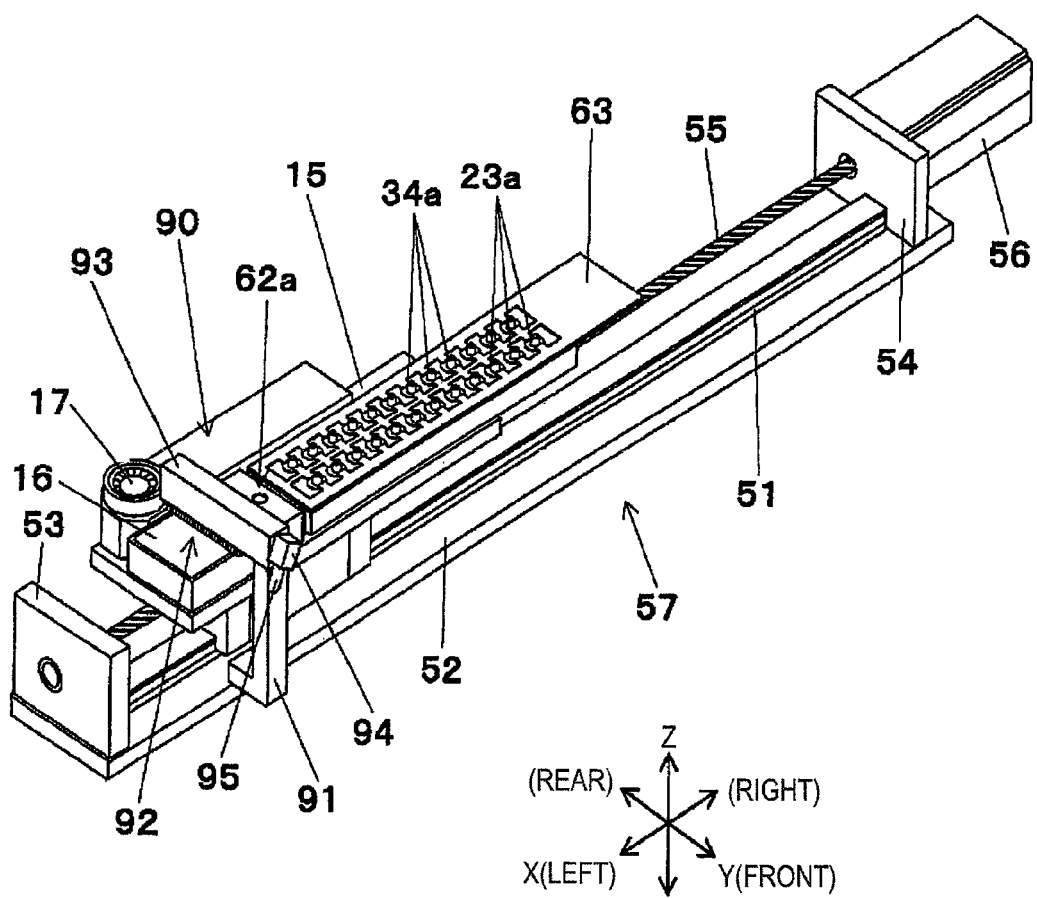
FIG. 6 is a perspective view of the movable table and the movable table moving mechanism which are provided on the chip mounting system according to Embodiment 1 of the invention.

FIG. 1 is a perspective view of a chip mounting system of Embodiment 1 of the invention, FIGS. 2 and 3 are front views of a main part of the chip mounting system of Embodiment 1 of the invention, FIG. 4 is a block diagram showing a control system of the chip mounting system of Embodiment 1 of the invention, FIGS. 5 and 6 are perspective views of a movable table and a movable table moving mechanism which are provided on the chip mounting system of Embodiment 1 of the invention, and FIGS. 7, 8, 9 and 10 are front views of the main part of the chip mounting system of Embodiment 1 of the invention.

In FIGS. 1 and 2, in a chip mounting system 1, a chip feeding stage 3 and a substrate holding stage 4 are provided on a base table 2 in such a manner as to be aligned in a front and rear direction (a Y-axis direction) of the base table 2, and at one side portion of the base table 2, a Y-axis frame extending in the Y-axis direction is provided in such a manner as to be supported by two supporting posts which are provided on an upper surface of the base table 2 in positions which are aligned in the front and rear direction in such a manner as to rise therefrom. Hereinafter, in Embodiment 1, in the front and rear direction of the base table 2, a chip feeding stage 3 side is referred to as the front, and a substrate holding section 4 side as the rear. In addition, a horizontal direction which intersects the Y-axis direction at right angles is referred to as an X-axis direction, and a side where the Y-axis frame 5 is provided is referred to as the right, and an opposite side thereto as the left.

In FIG. 2, a chip feeding stage moving mechanism 6 is provided in a front area of the base table 2, and the chip feeding stage 3 is attached to the chip feeding stage moving mechanism 6. The chip feeding mechanism 6 is made up of an XY table unit, and the chip feeding stage 3 can be moved in a horizontal direction by driving the chip feeding stage moving mechanism 6. A semiconductor wafer 8 which is cut into a plurality of parts (chips) 7 is supported on the chip feeding stage 3 in such a state that the semiconductor wafer 8 is affixed to an upper surface of a sheet-like member 9, and an ejector 10 is provided below the semiconductor wafer 8 for pushing up a chip 7 from therebelow.

In FIG. 2, a shelf member 12 including a horizontal resting part 11 which covers part (a rear portion) of the chip feeding stage 3 from thereabove is provided in a front area of the base table 2 in such a manner as to rise therefrom. A substrate holding stage moving mechanism 13 is provided at a rear portion of the resting part 11 of the shelf member 12, and the substrate holding stage 4 is attached to the substrate holding stage moving mechanism 13. The substrate holding stage 4 is made up of an XY table unit, and the substrate holding stage 4 can be moved in a horizontal direction by driving the substrate holding stage moving mechanism 13. A substrate 14, which constitutes an object on which a chip 7 supplied from the chip feeding stage 3 is to be mounted, is held on the substrate holding stage 4.

In FIG. 2, a front area 11a of the resting part 11 of the shelf member 12 is positioned between the chip feeding stage 3 and the substrate holding stage 4. A movable table 15, which is able to move freely in the X-axis direction, is provided in the front area 11a of the resting part 11, and a transfer stage 16 and a chip recognition camera 17, whose image sensing plane 17a is oriented upwards, are provided on the movable table 15.

In FIG. 1, a pick-up head moving mechanism 20 is provided on a lower surface of the Y-axis frame 5. The pick-up head moving mechanism 20 includes a pick-up head holding arm 21 which projects in the X-axis direction (to the left) so as to extend horizontally, and a pick-up head 22 is provided at a leading end (a left end) of the pick-up head holding arm 21. A pick-up tool 23 made up of a suction nozzle is attached to the pick-up head 22.

The pick-up head moving mechanism 20 moves the pick-up head holding arm 21 in an XY direction (a horizontal direction) and a vertical direction (a Z-axis direction) and rotates the pick-up head holding arm 21 about the X-axis so as to turn over the pick-up head 22 (that is, the pick-up tool 23) upside down. A first sucking mechanism 24 (FIG. 4) is provided in an interior of the pick-up head 22 for performing a sucking operation of a chip 7.

In FIGS. 1 and 2, a head movement guide 25, which constitutes a stator of a linear motor, is provided on a left side of the Y-axis frame 5 in such a manner as to extend in the Y-axis direction. Two upper and lower rail portions 26 are formed on a left side of the head movement guide 25 in such a manner as to extend horizontally, and a front movable plate 27 and a rear movable plate 28, which constitute a mover of the linear motor, are provided on the two rail portions 26 in such a manner as to move freely along the rail portions 26 (along the head movement guide 25) in the horizontal direction (the Y-axis direction). A front end portion of the head movement guide 25 extends further forwards than a position lying above the chip feeding stage 3 (that is, towards an opposite side to a side where the substrate holding stage 4 lies), and a rear end portion of the head movement guide 25 extends further rearwards than the substrate holding stage 4.

The head movement guide 25 and the front movable plate 27 constitutes a linear motor in which the head movement guide 25 acts as a stator and the front movable plate 27 acts as a mover, and this linear motor constitutes a mounting head horizontally moving mechanism 30 (FIG. 4) for moving the front movable plate 27 along the head movement guide 25 in the horizontal direction (the Y-axis direction) by switching magnetic poles of the front movable plate 27.

A mounting head lifting plate 32 is attached to a left side of the front movable plate 27 via a mounting head lifting mechanism 31, and a mounting head 33 is attached to a left side of a lower portion of the mounting head lifting plate 32. When the mounting head lifting mechanism 31 is driven, the mounting head lifting plate 32 moves in a vertical direction relative to the front movable plate 27, whereby the mounting head 33 attached to the mounting head lifting plate 32 is lifted upwards or downwards.

A mounting tool 34 made up of a suction nozzle is detachably attached to the mounting head 33 in such a manner as to extend downwards. A second sucking mechanism 35 (FIG. 4) is provided in an interior of the mounting head 33 for performing a sucking operation of a chip 7 via the mounting tool 34.

The head movement guide 25 and the rear movable plate 28 constitutes a linear motor in which the head movement guide 25 acts as a stator and the rear movable plate 28 acts as a mover, and this linear motor constitutes an application head horizontally moving mechanism 40 (FIG. 4) for moving the rear movable plate 28 along the head movement guide 25 in the horizontal direction (the Y-axis direction) by switching magnetic poles of the rear movable plate 28.

An application head lifting plate 42 is attached to a left side of the rear movable plate 28 via an application head lifting mechanism 41. A plurality of (here, two) application heads 43 are attached to a left side of a lower portion of the application head lifting plate 42, and each application nozzle 43 holds a dispenser 44 which is made up of a container 44a which accommodates therein an adhesive and an application nozzle 44b which extends downwards from the container 44a. When the application head lifting mechanism 41 is driven, the application head lifting plate 42 moves in a vertical direction relative to the rear movable plate 28, whereby the application head 43 attached to the application head lifting plate 42 is lifted upwards or downwards.

Adhesives of different types are loaded in the containers 44a which are held by the respective application heads 43, so that the application heads 43 can apply the adhesives of different types independently of each other. In addition, one of the application heads 43 which performs adhesive application work is made to be positioned lower than the other application head 43 which does not perform adhesive application work by a mechanism, not shown, whereby the adhesive application work by either of the application heads 43 is enabled. An application mechanism 45 (FIG. 4) is provided in an interior of each of the application heads 43 for performing adhesive application work by the dispenser 44 to a substrate 14.

In FIG. 3, the pick-up head 22 has, as its movable region, a region R1 defined in the Y-axis direction over which the pick-up head 22 can pick up a chip 7 fed to the chip feeding stage 3 so as to transfer the chip 7 so picked up to the transfer stage 16 or so as to deliver the chip 7 picked up from the chip feeding stage 3 to the mounting tool 34 of the mounting head 33 directly over the chip recognition camera 17 (in such a state that the chip 7 is turned over upside down). Included in this movable region R1 of the pick-up head 22 are a point where the chip 7 fed to the chip feeding stage 3 is picked up (hereinafter, referred to as a pick-up point P1), a point where the chip 7 so picked up is transferred to be placed on the transfer stage 16 (hereinafter, referred to as a transfer point P2) and a point where the chip 7 picked up is delivered to the mounting head 33 directly above a moving locus defined in the X-axis direction of the chip recognition camera 17 (hereinafter, referred to as a delivery point P3). These pick-up point P1, transfer point P2 and delivery point P3 are determined respectively on the chip feeding stage 3, on the transfer stage 16 and above the moving locus defined in the X-axis direction of the chip recognition camera 17 as fixed points on a coordinate system based on the base table 2.

In FIG. 3, the mounting head 33 has, as its movable region, a region R2 defined in the Y-axis direction between a frontmost movable position (refer to the mounting head 33 shown by alternate long and short dash lines) where the mounting head 33 moves to reach a front end limit position and a rearmost movable position (refer to the mounting head 33 shown by solid lines) where the mounting head moves to reach a rear end limit position of the head movement guide 25. Included in this movable region R2 of the mounting head 33 is a point (hereinafter, referred to as a mounting point P4) where the chip 7 picked up at the transfer point P2 or the delivery point P3 is mounted on a substrate 14 held on the substrate holding stage 4, in addition to the pick-up point P1, the transfer point P2 and the delivery point P3. This mounting point P4 is also determined as a fixed point on the coordinate system based on the base table 2.

As has been described heretofore, the front area 11a of the resting part 11 of the shelf member 12 is positioned within a region R0 defined in the Y-axis direction between the chip feeding stage 3 and the substrate holding stage 4 (between the pick-up point P1 and the mounting point P4), and in the front area 11a of the resting part 11, a rail member 51 is provided in such a manner as to be supported on a frame member 52, and the rail member 51 extends in a horizontal direction (that is, the X-axis direction) which intersects at right angles the horizontal direction (that is, the Y-axis direction) in which the chip feeding stage 3 and the substrate holding stage 4 are aligned. A slider portion 15a is formed on a lower surface of the movable table 15, and this slider portion 15a is brought into engagement with the rail member 51 so that the whole movable table 15 is made to be movable in the X-axis direction.

In FIGS. 5 and 6, screw supporting members 53, 54 are provided at left and right end portions of the frame member 52 in such a manner as to rise therefrom, and both end portions of a feeding screw 55 which extends parallel to the rail member 51 (that is, in the X-axis direction) are rotatably supported in both the screw supporting members 53, 54. A nut portion 15b (FIG. 2) is provided on a lower surface of the movable table 15 in such a manner as to be screwed on the feeding screw 55, and when the feeding screw 55 is caused to rotate about the X-axis by a table moving motor 56 attached to the right-hand screw supporting member 54, the movable table 15 moves along the rail member 51 in the X-axis direction. In this way, the slider portion 15a, the nut portion 15b, the rail member 51 and the table moving motor 56 constitute a movable table moving mechanism 57 for moving the movable table 15 positioned between the chip feeding stage 3 and the substrate holding stage 4 in the X-axis direction.

In FIGS. 5 and 6, the transfer stage 16, which has been described above, a reference stage 61, a chip disposing portion 62 and a tool holding member 63 are provided on an upper surface of the movable table 15 sequentially in that order from the left thereof. In addition, the chip recognition camera 17 is provided at the rear of the movable table 15 in such a posture that the image sensing plane 17a is oriented upwards. The reference stage 61 includes a reference mark 61a provided on an upper surface thereof, and a disposable chip discarding opening 62a is opened in an upper surface of the chip disposing portion 62. A replacement pick-up tool (denoted by reference numeral 23a) for the pick-up tool 23 provided on the pick-up head 22 and a replacement mounting tool (denoted by reference numeral 34a) for the mounting tool 34 provided on the mounting head 33 are held on the tool holding member 63. Here, the reference mark 61a is for calibrating therewith the movable table 15 with respect to a position error which would be caused by virtue of thermal expansion of the feeding screw 55.

In FIGS. 1 and 2, a chip feeding stage camera 71, a transfer stage camera 72 and a substrate holding stage camera 73 are provided above the left side of the head movement guide 25 sequentially in that order from the front thereof in such a posture that their image sensing planes are oriented downwards. As is shown in FIG. 3, an optical axis L1 of the chip feeding stage camera 71 passes through the pick-up point P1 which is set on the chip feeding stage 3, and an optical axis L2 of the transfer stage camera 72 passes through the transfer point P2 which is set on the transfer stage 16. In addition, an optical axis L3 of the chip recognition camera 17 is made to pass through the delivery point P3 which is set above the chip recognition camera 17 when the movable table 15 moves in the X-axis direction, and an optical axis L4 of the substrate holding stage camera 73 passes through the mounting point P4 which is set on the substrate holding stage 4.

In FIG. 4, a control unit 80 provided on this chip mounting system 1 controls the operation of the chip feeding stage moving mechanism 6 to move the chip feeding stage 3 in the horizontal direction relative to the base table 2, controls the operation of the substrate holding stage moving mechanism 13 to move the substrate holding stage 4 in the horizontal direction relative to the base table 2 and controls the operation of the movable table moving mechanism 57 to move the movable table 15 along the rail member 51 in the X-axis direction relative to the base table 2.

In addition, the control unit 80 controls the operation of the pick-up head moving mechanism 20, which has been described above, to move and rotate the pick-up head 22 in the Y-axis and Z-axis directions and about the X-axis, respectively, and controls the operation of the first sucking mechanism 24 to cause the pick-up head 22 to such the chip 7 via the pick-up tool 23.

Additionally, the control unit 80 controls the operation of the mounting head horizontally moving mechanism 30 to move the mounting head 33 attached to the front movable plate 27 in the horizontal direction (the Y-axis direction), controls the operation of the mounting head lifting mechanism 31 to lift the mounting head 33 upwards or downwards, and controls the operation of the second sucking mechanism 35 to cause the mounting head 33 to suck the chip 7 via the mounting tool 34.

Furthermore, the control unit 80 controls the operation of the application head horizontally moving mechanism 40 to move the application head 43 attached to the rear movable plate 28 in the horizontal direction (the Y-axis direction), controls the operation of the application head lifting mechanism 41 to lift the application head 43 upwards or downwards, and controls the operation of the application mechanism 45 to cause the application head 43 (the dispenser 44) to apply the adhesive to the substrate 14.

In addition, the control unit 80 drives the ejector 10 to push the chip 7 lying at the pick-up point P1 on the chip feeding stage 3 upwards.

Additionally, the control unit 80 controls the operation of the chip feeding stage camera 71 to cause the same camera to perform an image sensing operation within a region including the pick-up point P1, controls the operation of the transfer stage camera 72 to cause the same camera to perform an image sensing operation within a region including the transfer point P2, controls the operation of the substrate holding stage camera 73 to cause the same camera to perform an image sensing operation within a region including the mounting point P4, and controls the operation of the chip recognition camera 17 to cause the same camera to perform an image sensing operation within a region including the delivery point P3 (however, for the delivery point P3 to be included within an image sensing field of the chip recognition camera 17, the position of the movable table 15 needs to be adjusted in the X-axis direction). Images sensed by the chip feeding stage camera 71, the transfer stage camera 72, the substrate holding stage camera 73 and the chip recognition camera 17 are inputted into the control unit 80.

In addition, the control unit 80 recognizes the position of the reference mark 61a by sensing the image of the reference mark 61a periodically or at predetermined timings, so as to perform a calibrating operation in which the movable table 15 is calibrated with respect to its position error in the X-axis direction.

Next, three mounting procedures will be described for mounting a chip 7 resting on the chip feeding stage 3 on to a substrate 14 held on the substrate holding stage 4 in the chip mounting system 1.

Firstly, referring to FIG. 2, a first mounting procedure will be described for mounting a chip 7 (here, a type of chip which is mounted face up on a substrate 14) resting on the chip feeding stage 3 on to a chip mounting target position on a substrate 14 held on the substrate holding stage 4 by way of the transfer stage 16. To start the procedure, firstly, the control unit 80 controls the operation of a wafer transporting mechanism, not shown, to cause a semiconductor wafer 8 which is cut into a plurality of chips 7 to be held on the chip feeding stage 3 and controls the operation of a substrate transporting mechanism, not shown, to cause a substrate 14 which constitutes a chip mounting object to be held on the substrate holding stage 4 (a preparatory step). The respective chips 7 on the chip feeding stage 3 are in such a state that their circuit forming surfaces are oriented upwards at a point in time at which the preparation step is completed.

When the preparatory step is completed, the control unit 80 moves the transfer stage 16 in the X-axis direction, so that a predetermined position (for example, a central position of the transfer stage 16) on the transfer stage 16 is positioned at the transfer point P2 (a transfer stage aligning step).

When the transfer stage aligning step is completed, the control unit 80 moves the semiconductor wafer 8 within a horizontal plane on the chip feeding stage 3 to position a chip 7 which is to be mounted at the pick-up point P1 while referring to an image sensed by the chip feeding stage camera 71 (a chip aligning step) while moving the substrate 14 within a horizontal plane on the substrate holding stage 4 to position a chip mounting target position on the substrate 14 at the mounting point P4 while referring to an image sensed by the substrate holding stage camera 73 (a substrate aligning step).

When the chip aligning step and the substrate aligning step are completed, the control unit 80 positions the pick-up head 22 at the pick-up point P1 so that the chip 7 is allowed to be sucked by the pick-up tool 23 (a pick-up head's picking up step, which is indicated by an arrow A1 in FIG. 2). In this pick-up head's picking up step, to enable an easy sucking of the chip 7 by the pick-up tool 23, the control unit 80 activates the ejector 10 so that the chip 7 is pushed upwards from therebelow by the ejector 10.

When the pick-up head's picking up step is completed, the control unit 80 moves the pick-up head 22 from the pick-up position P1 to the transfer point P2 so as to transfer the chip 7 on to the transfer stage 16 (a chip transfer step, which is indicated by an arrow A2 in FIG. 2). The pick-up head 22, which has transferred the chip 7 on to the transfer stage 16, is then moved to the pick-up point P1 for performing the next pick-up head picking up step.

When the chip transfer step is completed, the control unit 80 calculates a position error of the chip 7 resting on the transfer stage 16 from the transfer point P2 by referring to an image sensed by the transfer stage camera 72 (a position error calculation step). Here, when an amount of position error of the chip 7 from the transfer point P2 in the X-axis direction is obtained, the control unit 80 moves the movable table 15 in the X-axis direction, so as to calibrate the movable table 15 with respect to the amount of position error in the X-axis direction (an X-axis direction position calibration step).

When the position error calculation step and the X-axis direction position calibration step are completed, the control unit 80 positions the mounting head 3 above the transfer point 2 and causes the mounting tool 34 to suck the chip 7 that has been placed at the transfer point P2 in the chip transfer step to pick up the chip 7 (a mounting head's picking up step, which is indicated by an arrow A3 in FIG. 2). As this occurs, the position of the mounting head 33 lying above the transfer point P2 is adjusted in the Y-axis direction so as to be calibrated with respect to an amount of position error of the chip 7 in the Y-axis direction from the transfer point P2 which has been obtained in the position error calculation step.

In addition, the control unit 80 moves the application head 43 from a waiting position (a rear end portion area of the head movement guide 25. Refer to the position of the application heads 43 shown in FIG. 2) to a position above the mounting point P4 and causes the application head 43 so moved to apply an adhesive to the mounting point P4 (that is, the chip mounting target position on the substrate 14) (an adhesive application step, which is indicated by an arrow A4 in FIG. 2) substantially at the same time as the mounting head's picking up step is carried out.

When the adhesive application step is completed, the control unit 80 withdraws the application head 43 from the mounting point P4 to the waiting position (an application head withdrawal step). Then, immediately after completion of the application head withdrawal step, the control unit 80 moves the mounting head 33 from the transfer point P2 to a position above the mounting point P4, so as to allow the chip 7 which was picked up in the mounting head's picking up step to be mounted on to the mounting point P4 (a chip mounting step, which is indicated by an arrow A5 in FIG. 2). By this series of actions, the chip 7 which was fed to the pick-up point P1 on the chip feeding stage 3 is mounted on to the chip mounting target position on the substrate 14 by way of the transfer stage 16.

In this way, when the chip 17 has been mounted in the chip mounting target position on the substrate 14, continuously, the series of steps after the preparatory step (the transfer stage aligning step→the chip aligning step and the substrate aligning step→ . . . →the chip mounting step) is repeated.

In addition, in the chip mounting step, when the chip 7 picked up from the transfer point P2 by the mounting head 33 passes over the chip recognition camera 17, the control unit 80 stops temporarily the movement of the mounting head 33 so that the chip 7 sucked to the mounting tool 34 stays within the image sensing field of the chip recognition camera 17, whereby an image of the chip 7 sucked to the mounting tool 34 is sensed (recognized) by the chip recognition camera 17 so as to obtain information on the position of the chip 7. By this action, the control unit 80 can calculate a suction error of the chip 7 relative to the mounting tool 34, so that the chip 7 can be mounted in the chip mounting target position on the substrate 14 by adjusting the moving amount of the mounting head 33 in such a way as to correct the suction error when the chip 7 is mounted on the substrate 14.

Next, referring to FIG. 7, a second mounting procedure will be described for mounting a chip 7 (here, a type of chip which is mounted face down on a substrate 14) resting on the chip feeding stage 3 on to a chip mounting target position on a substrate 14 by bypassing the transfer stage 16.

Firstly, the control unit 80 moves in advance the transfer stage 16 in the X-axis direction, so that the delivery point P3 enters the image sensing field of the chip recognition camera 17. Next, the control unit 80 performs the preparatory step, which has been described in the first mounting procedure. At a point in time at which the preparatory step is completed, respective chips 7 on the chip feeding stage 3 are in such a state that their circuit forming surfaces are oriented upwards.

When the preparatory step is completed, the control unit 80 moves a semiconductor wafer 8 resting on the chip feeding stage 3 within a horizontal plane, and then performs the chip aligning step and the substrate aligning step which have been described in the first mounting procedure.

Figure 7:
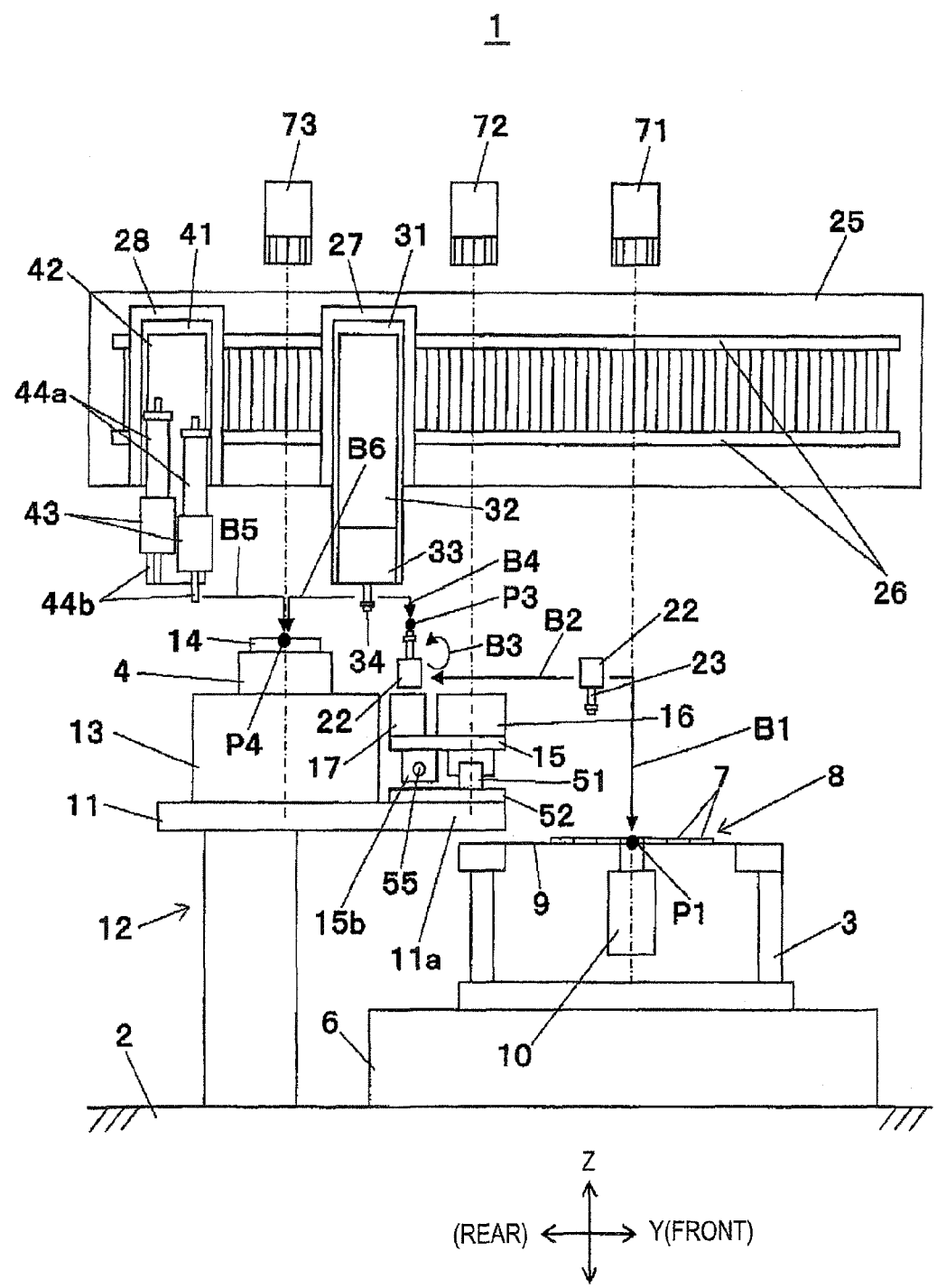
FIG. 7 is a front view of the main part of the chip mounting system according to Embodiment 1 of the invention.

When the chip aligning step and the substrate aligning step are completed, the control unit 80 positions the pick-up head 22 in the pick-up point P1, so that a chip 7 is caused to be sucked by the pick-up tool 23 (a pick-up head's picking up step, which is indicated by an arrow B1 in FIG. 7).

When the pick-up head's picking up step is completed, the control unit 80 moves the pick-up head 22 to a position directly below the delivery point P3 (which also constitutes a position directly above the chip recognition camera 17) (a chip moving step, which is indicated by an arrow B2 in FIG. 7). Then, the control unit 80 rotates the pick-up head 22 180 degrees about the X-axis so as to position the chip 7 sucked to the pick-up tool 23 at the delivery point P3 in such a state that the chip 7 sucked to the pick-up tool 23 is turned over vertically (a chip turning over step, which is indicated by an arrow B3 in FIG. 7).

When the chip turning over step is completed, the control unit 80 positions the mounting head 33 to a position above the delivery point P3 (which also constitutes a position directly above the chip recognition camera 7), so that the chip 7 which has been position at the delivery point P3 in the chip turning over step is caused to be sucked by the mounting tool 34 (a mounting head's picking up step, which is indicated by an arrow B4 in FIG. 7). By this series of actions, the chip 7 is delivered from the pick-up head 22 to the mounting head 33, and the pick-up head 22 which has delivered the chip 7 to the mounting head 33 is moved back to the pick-up point P1 to perform the next pick-up head's picking up step.

Substantially at the same time as the mounting head's picking up step is carried out, the control unit 80 performs the adhesive application step (which is indicated by an arrow B5 in FIG. 7) and the application head withdrawal step which have been described in the first mounting procedure, and immediately after the application head withdrawal step is completed, the control unit 80 causes the chip 7 picked up by the mounting head 33 to be mounted on to the mounting point 4 (a chip mounting step, which is indicated by an arrow B6 in FIG. 7). By this series of actions, the chip 7 fed to the pick-up point P1 on the chip feeding stage 3 is mounted in the chip mounting target position on the substrate 14 by bypassing the transfer stage 16.

In this way, when the chip 17 has been mounted in the chip mounting target position on the substrate 14, continuously, the series of steps after the preparatory step (the chip aligning step and the substrate aligning step→ . . . →the chip mounting step) is repeated.

In addition, in the chip mounting step, after the chip 7 delivered from the pick-up head 22 is picked up by the mounting head 33, the pick-up head 22 is moved back to the pick-up point P1 (that is, towards the front in the Y-axis direction) to perform the next pick-up head's picking up step, whereupon an image of the chip 7 sucked to the mounting head 33 is sensed (recognized) so as to obtain information on the position of the chip 7, whereby an suction error of the chip 7 relative to the mounting tool 24 is made to be corrected when the chip 7 is mounted on the substrate 14.

Next, referring to FIG. 8, a third mounting procedure will be described for picking up a chip 7 (here, a type of chip which is mounted face up on a substrate 14) resting on the chip feeding stage 3 by the mounting head 33 and mounting the chip 7 so picked up directly on to a chip mounting target position on a substrate 14 by bypassing the transfer stage. To make this happen, the control unit 80 firstly performs in advance the preparatory step, the chip aligning step and the substrate aligning step which have been described in the first mounting procedure.

Figure 8:
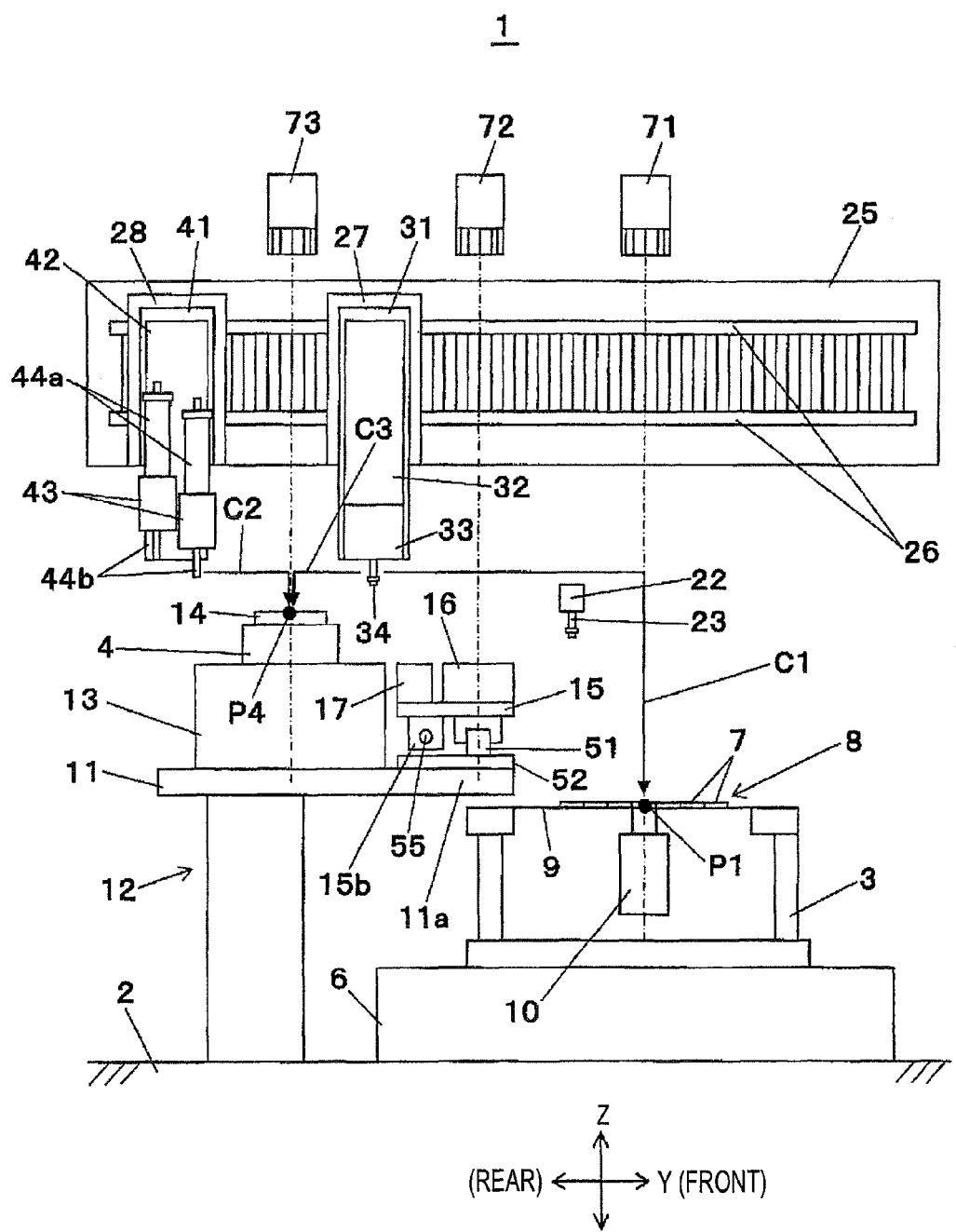
FIG. 8 is a front view of the main part of the chip mounting system according to Embodiment 1 of the invention.
Figure 9:
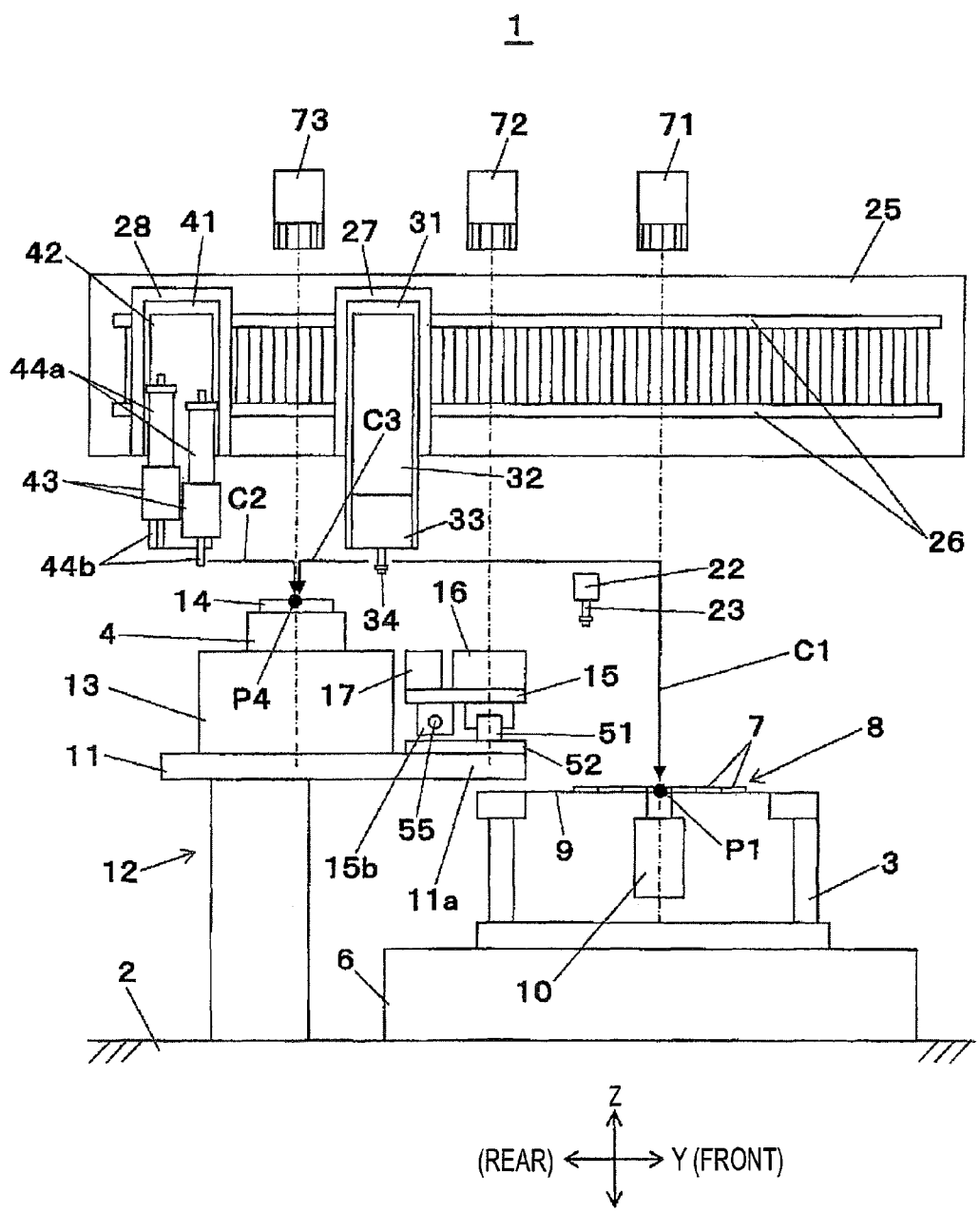
FIG. 9 is a front view of the main part of the chip mounting system according to Embodiment 1 of the invention.

When the chip aligning step and the substrate aligning step are completed, the control unit 80 positions the mounting head 33 in a position above the pick-up point P1, so that a chip 7 resting at the pick-up pint P1 is caused to be sucked to be picked up by the mounting tool 34 (a mounting head's picking up step, which is indicated by an arrow C1 in FIG. 8). Then, substantially at the same time as the mounting head's picking up step is carried out, the control unit 80 performs the adhesive application step (which is indicated by an arrow C2 in FIG. 8) and the application head withdrawal step which have been described in the first mounting procedure, and causes the chip 7 picked up by the mounting head 33 to be mounted at the mounting point P4 (a chip mounting step, which is indicated by arrow C3 in FIG. 8). By this series of actions, the chip 7 which is delivered to the pick-up point P1 on the chip feeding stage 3 is mounted directly on to the chip mounting target position on the substrate 14 by bypassing the transfer stage 16. The mounting head 33 which has mounted the chip 7 on to the substrate 14 is then moved back to the pick-up point P2 to perform the next mounting head's picking up step.

In this way, when the chip 17 has been mounted in the chip mounting target position on the substrate 14, continuously, the series of steps after the preparatory step (the chip aligning step and the substrate aligning step→ . . . →the chip mounting step) is repeated.

In addition, in the chip mounting step, when the chip 7 picked up from the pick-up point P1 by the mounting head 33 passes over the chip recognition camera 17, the control unit 80 stops temporarily the movement of the mounting head 33 so that the chip 7 sucked to the mounting tool 34 stays within the image sensing field of the chip recognition camera 17 which is positioned in advance in a predetermined position, whereby an image of the chip 7 is sensed (recognized) by the chip recognition camera 17 to obtain information on the position of the chip 7, thereby a suction error of the chip 7 relative to the mounting tool 34 being made to be corrected when the chip 7 is mounted on to the substrate 14.

Incidentally, in the chip mounting system 1 that has been described heretofore, the pick-up tool 23 provided on the pick-up head 22 and the mounting tool 34 provided on the mounting head 33 need to be changed in accordance with the shape of the chip 7 to be mounted on the substrate 14 in the course of mounting chips. Although these replacement tools (the replacement pick-up tool 23a and the replacement mounting tool 34a) are held by the tool holding member 63 as has been described before (FIGS. 5, 6 and 9), since the tool holding member 63 is provided in the region R0 (FIG. 3) defined in the Y-axis direction between the chip feeding stage 3 and the substrate holding stage 4 (the pick-up point P1 and the mounting point P4) or specifically, in an overlapping region R (FIG. 3) of the movable region R1 of the pick-up head 22 defined in the Y-axis direction and the movable region R2 of the mounting head 33 defined in the Y-axis direction (on the movable table 15 provided within the overlapping region R), the tool holding member 63 can be accessed from both the pick-up head 22 and the mounting head 33 for replacement of the tools (the pick-up tool 23 and the mounting tool 34) (refer to a moving path D1 of the pick-up head 22 and a moving path D2 of the mounting head 33 which are shown in FIG. 9).

In addition, in this embodiment, while since the tool holding member 63 is provided in the overlapping region R of the movable region R1 of the pick-up head 22 and the movable region R2 of the mounting head 33, the replacement of the tools of the pick-up head 22 and the mounting head 33 is enabled, in the event that only one of the tools of the pick-up head 22 and the mounting head 33 may be able to be replaced, the tool holding member 63 does not necessarily have to be provided within the overlapping region R of the movable region R1 of the pick-up head 22 and the movable region R2 of the mounting head 33. In this case, of the pick-up head and the mounting head 33, only the tool of the head which has the tool holding member 63 within in its movable region can be replaced.

In addition, as has been described above, the chip disposing portion 62 (FIGS. 5, 6) is provided on the movable table 15, and as with the transfer stage 16 and the tool holding member 63, since the chip disposing portion 62 is also provided within the overlapping region R of the movable region R1 of the pick-up head 22 and the movable region R2 of the mounting head 33, both the pick-up head 22 and the mounting head 33 can access the chip disposing portion 62 on the movable table 15, so that chips 7 which are determined to be unsuitable for mounting before mounting on substrates 14 can be disposed into the disposable chip discarding opening 62a.

Figure 10:
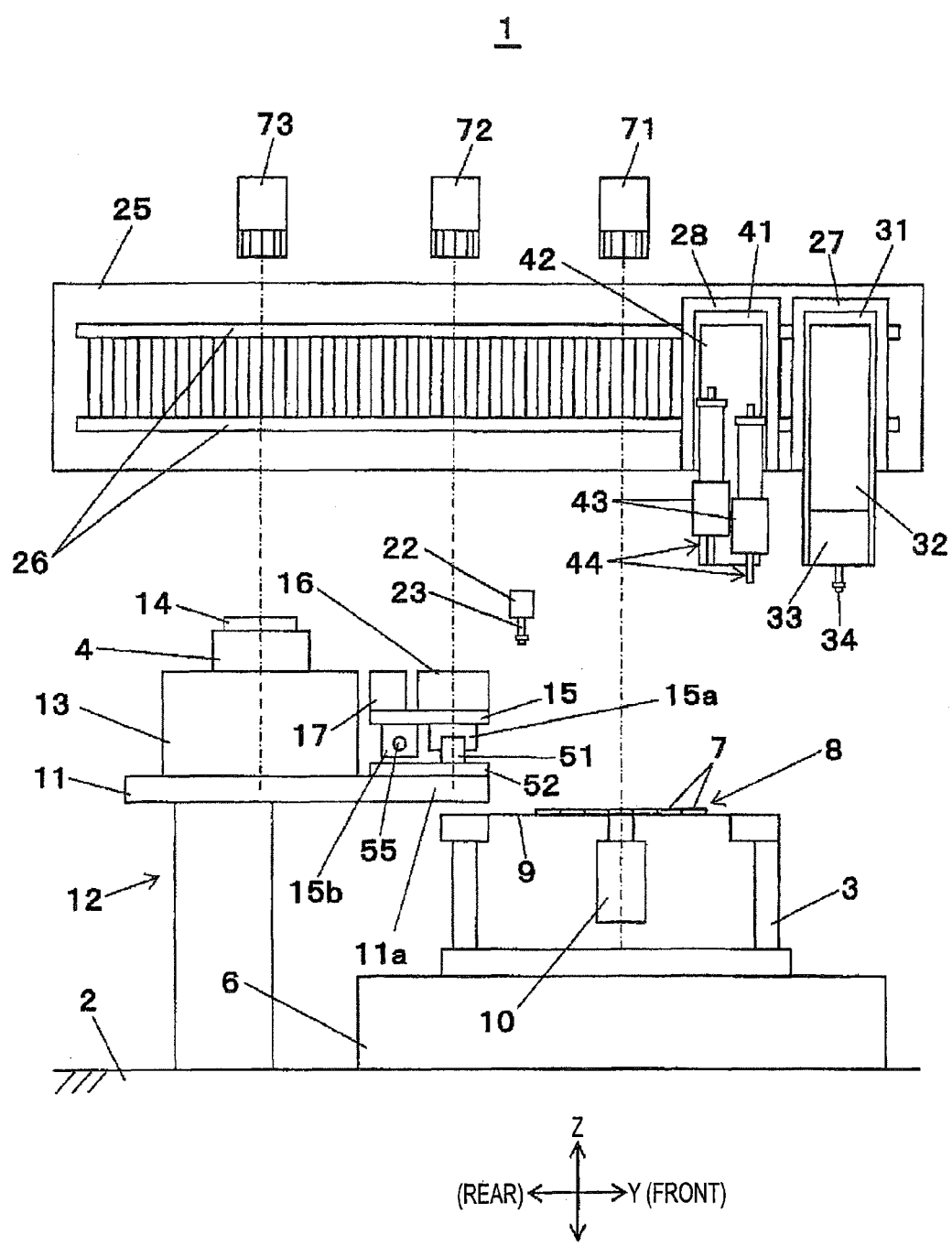
FIG. 10 is a front view of the main part of the chip mounting system according to Embodiment 1 of the invention.

In addition, in the chip mounting system 1, when performing maintenance work for the mounting head 33 and the application head 43, as is shown in FIG. 10, the mounting head 33 and the application head 43 are moved as forwards as possible along the head movement guide 25 in the Y-axis direction. Here, as has been described above, since the front end portion of the head movement guide 25 extends further forwards then the position lying above the chip feeding stage 3 (towards the opposite side to the side where the substrate holding stage 4 lies), not only the mounting head 33 but also the application head 43 can be moved as forwards as the position lying above the chip feeding stage 3, whereby the operator can implement the maintenance work for the mounting head 33 and the application head 43 extremely easily.

Additionally, since the placement and pick-up of chips 7 are repeatedly performed on the transfer stage 16, the surface thereof gets dirty with dust of silicone, and hence, the surface of the transfer stage 16 needs to be cleaned periodically. A transfer stage cleaner 90 which is provided in a leftward position on the frame member 52 in FIGS. 5 and 6 is used to clean the transfer stage 16.

As is shown in FIGS. 5 and 6, this transfer stage cleaner 90 has a vertical portion 91 which is provided in such a manner as to extend upwards from the frame member 52 and a brush portion 93 which extends horizontally from an upper end portion of the vertical portion 91 in such a manner as to cross the frame member 52 (that is, in the Y-axis direction) and includes a number of brush fibers 92 which are planted on a lower surface thereof in such a manner as to extend downwards. When the control unit 80 controls the operation of the table moving motor 56 so as to move repeatedly the movable table 15 along the rail member 51 in the X-axis direction, the surface of the transfer stage 16 is made to be swept and cleaned by the brush fibers 92 (FIG. 6). A suction opening, not shown, is provided on the lower surface (the surface where the brush fibers 92 planted) of the brush portion 93, and this suction opening is connected to an interior suction duct line, not shown, which extends through an interior of the brush portion 93 and a connector 94 which is fixed to the vertical portion 91 and is linked with a vacuum suction mechanism, not shown, via an exterior suction duct line 95. The control unit 80 controls the operation of the vacuum suction mechanism to suck air from the exterior suction duct line 95 and the interior suction duct line so that dust or the like which is removed from the surface of the transfer stage 16 by the brush fibers 92 can be sucked out from the suction hole to the outside of the system.

Embodiment 2

Figure 11:
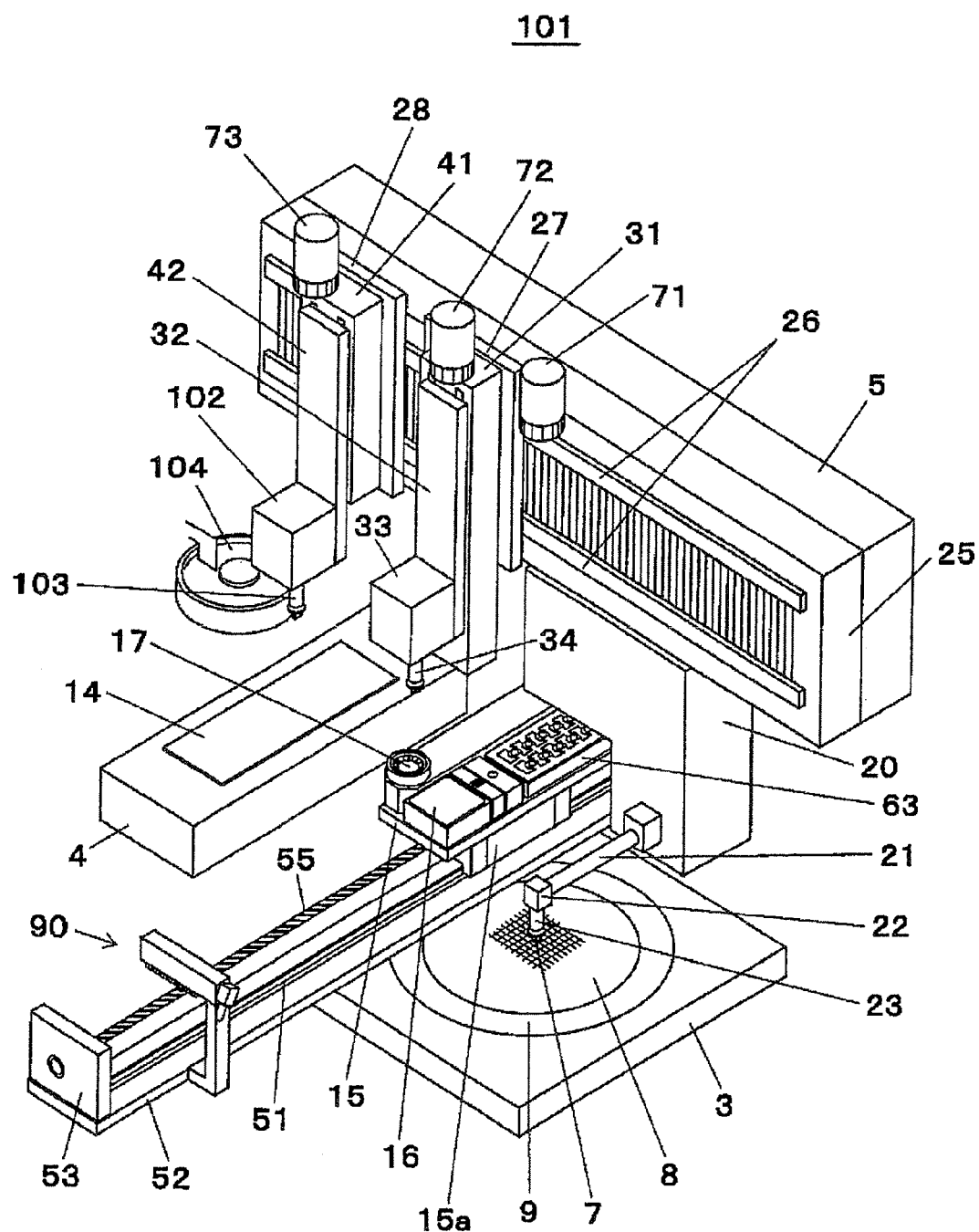
FIG. 11 is a perspective view of a chip mounting system according to Embodiment 2 of the invention.
Figure 12:
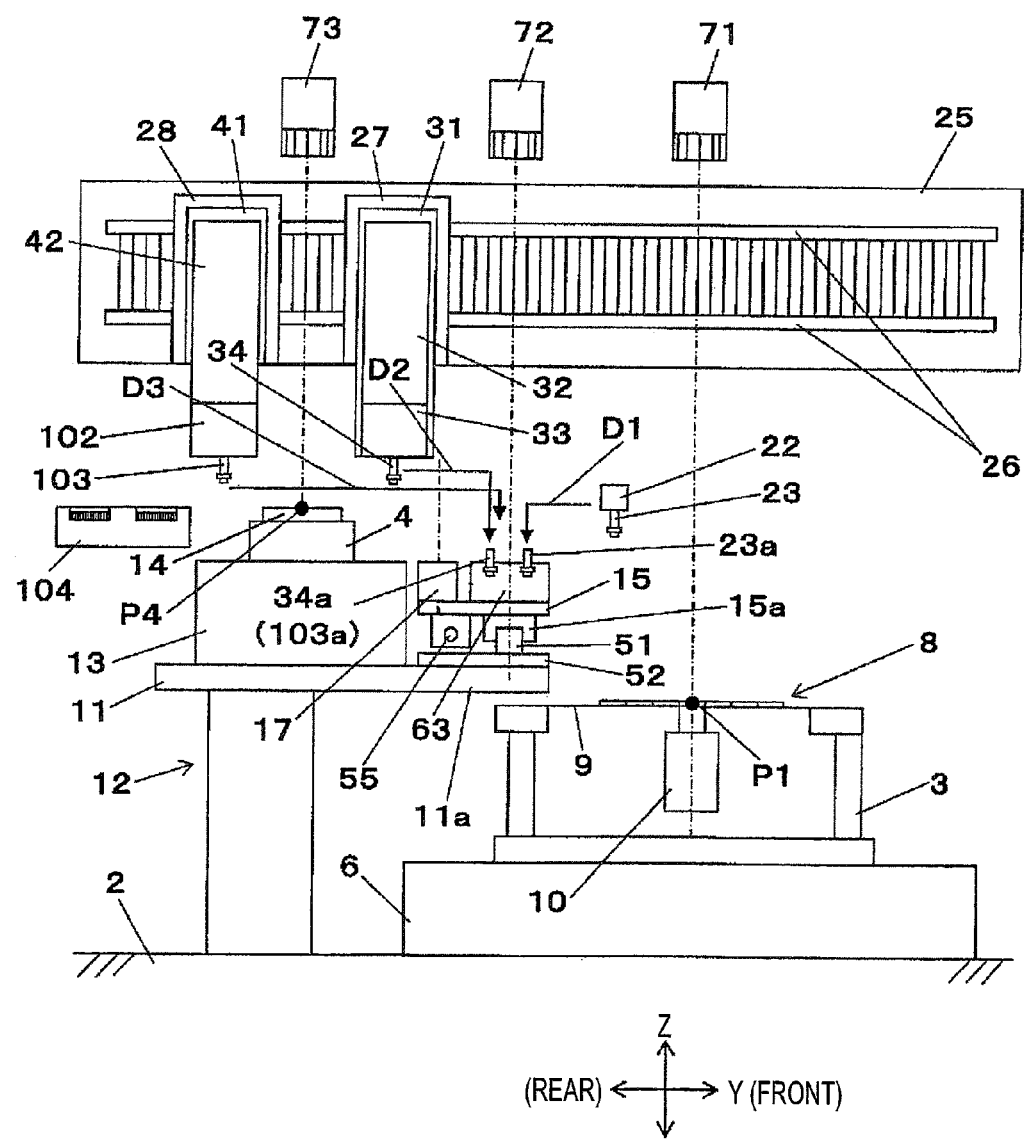
FIG. 12 is a front view of a main part of the chip mounting system according to Embodiment 2 of the invention.
Figure 13:
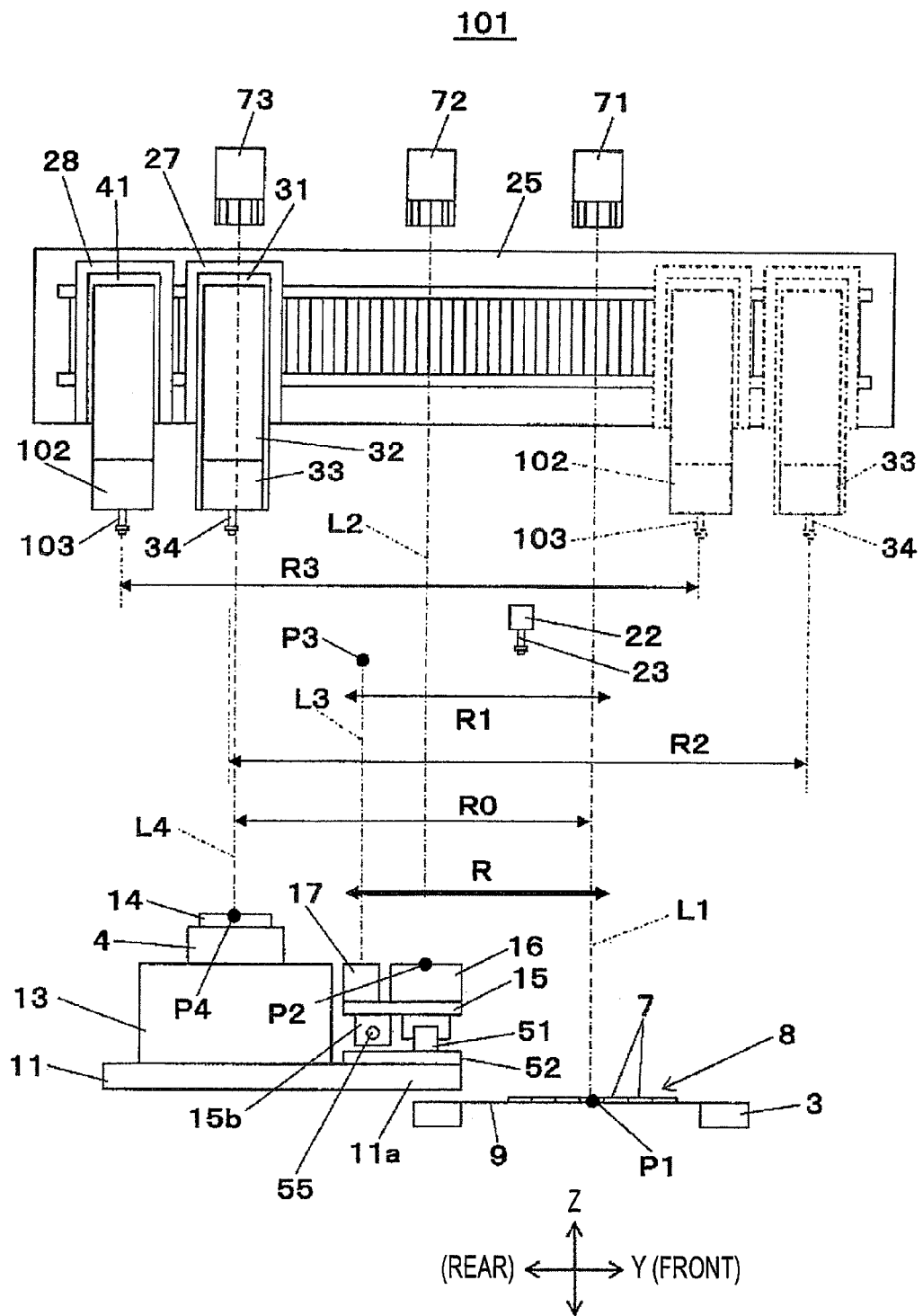
FIG. 13 is a front view of the main part of the chip mounting system according to Embodiment 2 of the invention.

FIG. 11 is a perspective view of a main part of a chip mounting system according to Embodiment 2 of the invention, and FIGS. 12 and 13 are front views of the main part of the chip mounting system according to Embodiment 2 of the invention.

In FIGS. 11 and 12, a chip mounting system 101 of Embodiment 2 differs from the chip mounting system 1 of Embodiment 1 in the configuration of an application head 102. The application head 102 of the chip mounting system 101 is not made up of the dispenser 44 which is used in Embodiment 1 but holds detachably an application tool 103 like a stamp (pin). A paste (for example, a soldering paste) within a paste container 104 is caused to adhere to a lower end face of the application tool 103, and the paste so adhering is then applied (transferred) to a chip mounting target position on a substrate 14 held on a substrate holding stage 4 by moving the application head 102 vertically.

Although chip mounting procedures by this chip mounting system 101 are similar to those of Embodiment 1, as with a pick-up tool 23 provided on a pick-up head 22 and a mounting tool 34 provided on a mounting head 33, the application tool 103 needs to be changed in accordance with the shape of chips 7 to be mounted on substrates 14. A replacement tool (a replacement application tool 103a) for the application tool 103 is, as is shown in FIG. 12, held on a tool holding member 63 as in the same way as that in which the replacement tools (the replacement pick-up tool 23a and the replacement mounting tool 34a) of the pick-up head 22 and the mounting head 33.

In Embodiment 2, since the tool holding member 63 is provided in a region R0 (FIG. 13) defined in a Y-axis direction between the chip feeding stage 3 and the substrate holding stage 4 (a pick-up point P1 and a mounting point P4) or specifically, in an overlapping region R of a movable region R1 of the pick-up head 22 defined in the Y-axis direction, a movable region R2 of the mounting head 33 defined in the Y-axis direction and a movable region R3 of the application head 102 defined in the Y-axis direction (on the movable table 15 provided within the overlapping region R), the tool holding member 63 can be accessed from three constituent chips such as the pick-up head 22, the mounting head 33 and application head 102 for replacement of the tools (the pick-up tool 23, the mounting tool 34 and the application tool 103) (refer to a moving path D1 of the pick-up head 22, a moving path D2 of the mounting head 33, and a moving path D3 of the application head 102 which are shown in FIG. 12).

As has been described heretofore, in the chip mounting system 1 (101) of the embodiment, since the movable table 15 which can move in the horizontal direction (the second direction, the X-axis direction) which intersects at right angles the horizontal direction (the first direction, the Y-axis direction) in which the chip feeding stage 3 and the substrate holding stage 4 are aligned is provided in the region R0 defined between the chip feeding stage 3 for feeding chips 7 and the substrate holding stage 4 for holding a substrate 14 (between the pick-up point P1 and the mounting point P4), so that the transfer stage 16 and the tool holding member 63 are provided on the movable table 15, the whole chip mounting system 1 can be made compact in size irrespective of the fact that the transfer stage 16 and the tool holding member 63 are installed between the chip feeding stage 3 and the substrate holding stage 4.

In addition, the camera (the chip recognition camera 17) whose image sensing plane 17a is oriented upwards is provided on the movable table 15, and as has been described above, the recognition of the chip 7 picked up by the mounting head 33 is allowed to be implemented by this camera. Because of this, although done in the conventional chip mounting system, the chip recognition camera does not have to be provided on the base table 2, and hence, the chip mounting system 1 can be made more compact in size.

In addition, since the movable table 15 is made to move freely in the direction (the X-axis direction) which intersects at right angles the direction (the Y-axis direction) in which the chip feeding stage 3 and the substrate holding stage 4 are aligned and any position on the movable table 15 can be accessed from both the pick-up head 22 and the mounting head 33 when the movable table 15 is moved in the X-axis direction, the working properties of the system can be enhanced further in the event that other equipment which is shared by the pick-up head 22 and the mounting head 33 (in the case of the chip mounting system 101, shared also by the application head 102) than the tool holding member 63 is made to be mounted on the movable table 15.

While the embodiments of the invention have been described heretofore, the invention is not limited to the embodiments so described. For example, in the embodiments, while the chip feeding stage 3 which supports the semiconductor wafer 8 which is cut into the plurality of chips 7 has been described as the chip feeding section for feeding chips, the chip feeding section is not limited to such a stage-like configuration, and hence, other configurations than the stage-like one such as a tape feeder or a tray feeder may be adopted as the chip feeding section. In addition, in the embodiment, while in addition to the transfer stage 16, the tool holding member 63, and the chip recognition camera 17, the reference stage 61 and the chip disposing portion 62 have been described as devices which are to be provided on the movable table 15, types of devices that are to be mounted on the movable table 15 are not limited thereto, and hence, other devices can be provided which can enhance the working properties.

INDUSTRIAL APPLICABILITY

The chip mounting system is provided which can be made compact in size as a whole irrespective of the fact that the transfer stage and the tool holding member are installed between the chip feeding section and the substrate holding section.

The invention claimed is:

1. A chip mounting system, comprising:
   a chip feeding section for feeding chips;
   a substrate holding section for holding a substrate;
   a transfer stage disposed between the chip feeding section and the substrate holding section;
   a pick-up head provided so as to move freely in a first direction which is horizontal and in which the chip feeding section and the substrate holding section are aligned for picking up a chip fed from the chip feeding section with a pick-up tool to transfer the chip so picked up to a transfer stage;
   a mounting head provided so as to move freely in the first direction for picking up the chip transferred to the transfer stage by the pick-up head with a mounting tool to mount the chip on to a substrate held by the substrate holding section; and
   a tool holding member for holding at least a replacement tool for the pick-up tool or the mounting tool;
   wherein a movable table which is able to move freely in a second direction which is horizontal and which intersects the first direction at right angles is provided in an area lying between the chip feeding section and the substrate holding section, so that the transfer stage and the tool holding member are provided on the movable table.

2. The chip mounting system as set forth in claim 1, wherein a camera is provided on the movable table in such a manner that an image sensing plane is oriented upwards.

3. The chip mounting system as set forth in claim 1, further comprising:
   an application head provided movably in the first direction for applying using an application tool an adhesive to a substrate on to which a chip has not yet been mounted by the mounting head; and
   wherein the tool holding member is provided on an overlapping legion of the movable region of the pick-up head, the movable region of the mounting head and a movable region of the application head on the movable table, and a replacement tool for the application tool is held on the tool holding member.

4. A chip mounting system, comprising:
   a chip feeding section for feeding chips;
   a substrate holding section for holding a substrate;
   a pick-up head provided movably in a first direction which is horizontal and in which the chip feeding section and the substrate holding section are aligned for picking up a chip fed from the chip feeding section by a pick-up tool;
   a mounting head provided movably in the first direction for receiving the chip picked up by the pick-up head by a mounting tool so as to mount the chip so received on to a substrate held on the substrate holding section; and
   a tool holding member for holding replacement tools for the pick-up tool and the mounting tool, respectively;
   wherein the tool holding member is provided in an overlapping region of a movable region of the pick-up head and a movable region of the mounting head.

5. A chip mounting system, comprising:
   a chip feeding section for feeding chips;
   a substrate holding section for holding a substrate;
   a transfer stage disposed between the chip feeding section and the substrate holding section;
   a pick-up head provided so as to move freely in a first direction which is horizontal and in which the chip feeding section and the substrate holding section are aligned for picking up a chip fed from the chip feeding section with a pick-up tool to transfer the chip so picked up to a transfer stage;
   a mounting head provided so as to move freely in the first direction for picking up the chip transferred to the transfer stage by the pick-up head with a mounting tool to mount the chip on to a substrate held by the substrate holding section; and
   a chip disposing portion which both the pick-up head and the mounting head can access and into which a chip to be unsuitable for mounting is disposed by the pick-up head or the mounting head;
   wherein a movable table which is able to move freely in a second direction which is horizontal and which intersects the first direction at right angles is provided in an area lying between the chip feeding section and the substrate holding section, so that the transfer stage and the chip disposed portion are provided on the movable table.

6. The chip mounting system as set forth in claim 5, wherein a camera is provided on the movable table in such a manner that an image sensing plane is oriented upwards.

7. A chip mounting system, comprising:
a chip feeding section for feeding chips;
a substrate holding section for holding a substrate;
a pick-up head provided movably in a first direction which is horizontal and in which the chip feeding section and the substrate holding section are aligned for picking up a chip fed from the chip feeding section by a pick-up tool;
a mounting head provided movably in the first direction for receiving the chip picked up by the pick-up head by a mounting tool so as to mount the chip so received on to a substrate held on the substrate holding section; and
a chip disposing portion which both the pick-up head and the mounting head can access and into which a chip to be unsuitable for mounting is disposed by the pick-up head or the mounting head;
wherein the chip disposing portion is provided in an overlapping region of a movable region of the pick-up head and a movable region of the mounting head.

8. The chip mounting system as set forth in claim 7, wherein a camera is provided on the movable table in such a manner that an image sensing plane is oriented upwards.

* * * * *